(12) United States Patent
Cheung et al.

(10) Patent No.: US 6,344,767 B1
(45) Date of Patent: Feb. 5, 2002

(54) SWITCHED-OPAMP TECHNIQUE FOR LOW-VOLTAGE SWITCHED CAPACITOR CIRCUITS

(75) Inventors: Sin-Luen Cheung, Tai Po; Howard Cam Luong, Kln, both of (HK)

(73) Assignee: The Hong Kong University of Science and Technology, Kowloon (HK)

( * ) Notice: Subject to any disclaimer, the term of this patent is extended or adjusted under 35 U.S.C. 154(b) by 0 days.

(21) Appl. No.: 09/493,264

(22) Filed: Jan. 28, 2000

(51) Int. Cl.$^7$ ................................. G06G 7/18
(52) U.S. Cl. .................. 327/336; 327/337; 327/345
(58) Field of Search ........................ 327/334, 336, 327/337, 339, 344, 345, 554

(56) References Cited

U.S. PATENT DOCUMENTS

| | | | | |
|---|---|---|---|---|
| 4,352,069 A | * | 9/1982 | Dessoulavy | 328/127 |
| 4,644,304 A | * | 2/1987 | Temes | 333/173 |
| 5,698,999 A | * | 12/1997 | Etoh et al. | 327/94 |
| 5,745,002 A | | 4/1998 | Baschirotto et al. | 327/554 |
| 6,140,849 A | * | 10/2000 | Trask | 327/113 |

* cited by examiner

Primary Examiner—Tuan T. Lam
Assistant Examiner—Hiep Nguyen
(74) Attorney, Agent, or Firm—Burns, Doane, Swecker & Mathis, LLP (57) ABSTRACT

A switched capacitor circuit is described that uses two switchable operational amplifiers that operate in parallel and in alternate clock phases. In a preferred embodiment of the invention, the two operational amplifiers may be implemented by a single two-stage operational amplifier having a common input stage and two switchable output pairs. The novel switched capacitor circuit may be used in any application that uses a conventional switched capacitor circuit, such as an integrator and a filter means.

29 Claims, 9 Drawing Sheets

DIFFERENTIAL OUTPUT TRANSIENT RESPONSE WITH A 75-kHz 0.3-$V_{pp}$ INPUT SIGNAL

FIG. 9(b)

SINGLE-ENDED OUTPUT TRANSIENT RESPONSE WITH A 75-kHz 0.3-$V_{pp}$ INPUT SIGNAL

FIG. 9(a)

FREQUENCY SPECTRUM WITH A 75-kHz 0.3-$V_{pp}$ INPUT SIGNAL

FIG. 9(c)

FREQUENCY RESPONSE OF THE SC PSEUDO-2-PATH FILTER

FIG. 10

OUTPUT TRANSIENT WITH 75-kHz 0.3-$V_{pp}$ INPUT SIGNAL
USING 0.9-V SUPPLY

FIG. 12

FILTER FREQUENCY RESPONSE AT 0.9-V SUPPLY

FIG. 13

SWITCHED-OPAMP TECHNIQUE FOR LOW-VOLTAGE SWITCHED CAPACITOR CIRCUITS

FIELD OF THE INVENTION

This invention relates a novel switched-opamp technique for switched capacitor circuits, and in particular to a technique suitable for use at low operating voltages.

BACKGROUND OF THE INVENTION

Supply voltage scaling in future submicron CMOS technology is expected to require all transistors gate-to-source ($V_{GS}$) voltages to operate at less than 0.9V. Low-voltage operation is important to extend battery life in handheld devices and to allow the monolithic implementation of analog and digital circuits in a single chip. This has motivated new circuit techniques to be developed for low-voltage operation of analog circuits. Amongst these techniques are switched capacitor (SC) circuits that are capable of achieving high transfer function accuracy with low distortion in CMOS technology and are thus attractive for low-voltage operation.

Figure 1:
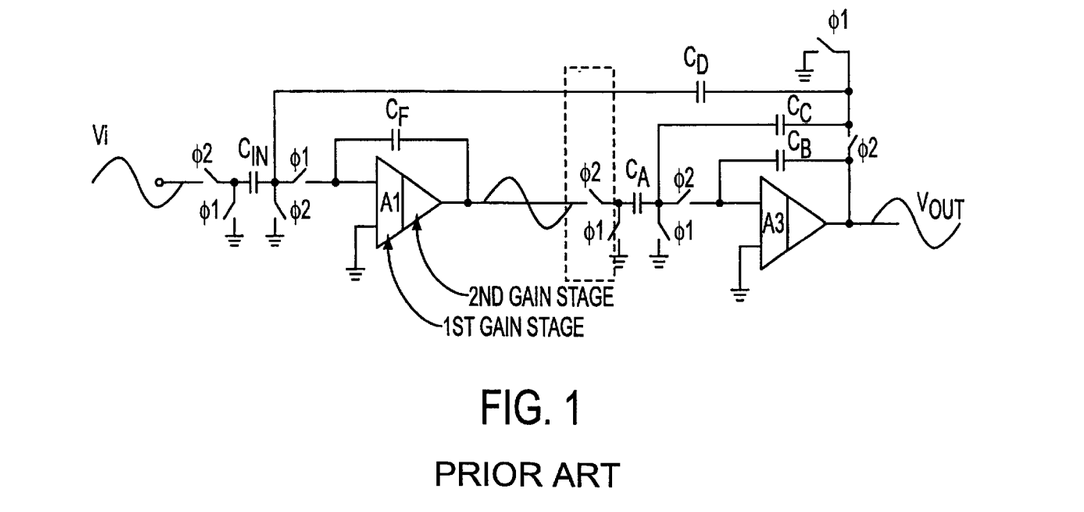
FIG. 1 is a circuit diagram of a conventional switched capacitor filter.

FIG. 1 shows a conventional SC filter design. The design includes two operational amplifiers and a number of capacitors that are switched between phases φ1 and φ2 by switches formed of NMOS and PMOS transistors. High-gain operational amplifiers can be realized with a supply voltage as low as 1V using a standard CMOS process and there is no lower limit on the operation of the capacitors. Furthermore the MOS switches that refer to ground can be operated with $V_{GS}$ at less than 1V. A problem exists, however, with the MOS switch connected to the output of the first operational amplifier A1 and which is shown in the dashed line of FIG. 1. Because of the nature of the output of the operational amplifier, the MOS switch requires at least 2V for proper operation.

PRIOR ART

A number of solutions have been proposed for this problem. One proposal for example is to use low-threshold voltage devices. However, such devices are not standard to CMOS technology and thus the cost is high. Furthermore such devices suffer from heavy leakage problems. Another proposal has been to use on-chip voltage multiplier devices to drive the switches. This proposal, however, dissipates a large amount of power and is not compatible with future low-voltage submicron technology.

Figure 2:
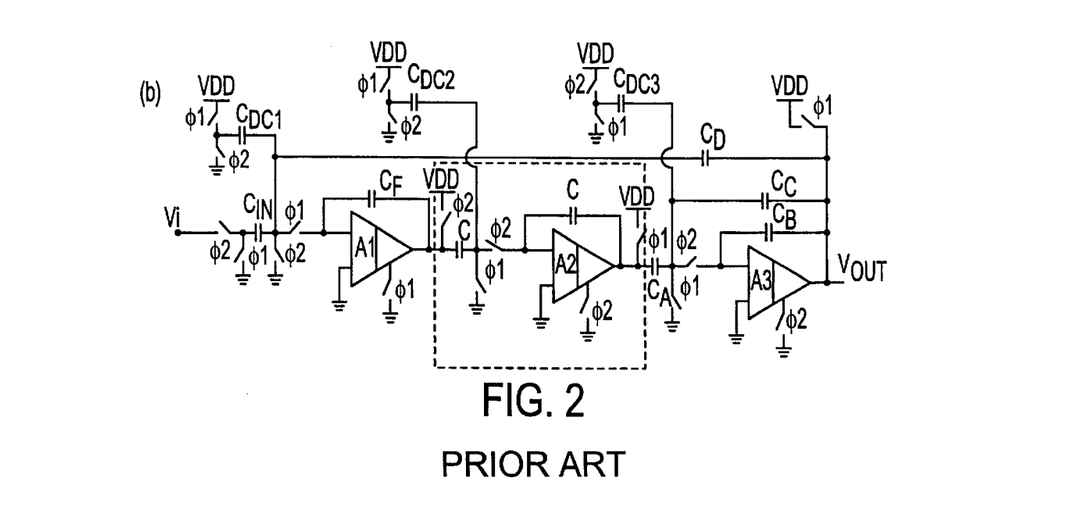
FIG. 2 is a circuit diagram illustrating the switched opamp technique of the prior art.

A more effective solution to the problem is a switched-opamp (SO) technique outlined in U.S. Pat. No. 5,745,002 (Baschirotto et al). FIG. 2 shows the basic design proposed in U.S. Pat. No. 5,745,002 and it will be noted that the problematic MOS switch of FIG. 1 is replaced by a switched opamp and capacitors as shown within the dashed line box of FIG. 2. The switched opamp and capacitors can be properly operated at 1V and below, and thus the main problem with the classical SC circuit can be overcome. The proposal of U.S. Pat. No. 5,745,002 has disadvantages of its own however.

Firstly, the previous switched-opamp technique cuts off the opamps after their integration phase, therefore it cannot implement multi-phase switched-capacitor systems and switched-capacitor techniques such as pseudo-N-path, double-sampling, capacitance-spread-reduction and same-sample-correction that require the opamps to be functional all the time. Besides, additional opamps are usually required in order to make use of the technique to realize low-voltage switched-capacitor circuits. Another disadvantage of the design of U.S. Pat. No. 5,745,002 is that the operation speed is limited by the turn on speed of the switchable opamps.

The operation speed can only be increased by using parallel processing scheme, however this requires a doubling of hardware and power consumption to double the speed and requires accurate control of the clock phases between different paths for proper operation. In addition mismatches between paths will also degrade the system performance.

SUMMARY OF THE INVENTION

According to the present invention there is provided a switched opamp circuit comprising two switchable operational amplifiers operating in parallel and in alternate clock phases.

In a preferred embodiment the two switchable operational amplifiers may be implemented by a single two-stage operational amplifier having a common input stage and two switchable output stages. In this embodiment at any given time only one of the switchable outputs is active and the other is non-active, but at any given time there is always one of the outputs active. Also in this embodiment a feedback circuit may be provided to maintain the common-mode voltage of the switchable output pairs at half the supply voltage for differential structures.

The present invention may be applied to any form of circuit that can be constructed using a switched capacitor circuit. A particularly useful realisation of the invention is as an integrator circuit which may in turn be incorporated within a filter means. It should be understood that this is an example only and that the invention may be applied to a wide range of circuit topologies.

When used in an integrator circuit, the two opamps, or the two output pairs when they are formed with a common input stage, may be provided with associated signal transformation means to provide any necessary transfer function. Examples of such signal transformation means may include feedback capacitors, or feedback switched capacitor networks.

A particular advantage of the present invention, is that one of the operational amplifiers of the switched capacitor circuit according to the present invention is always active and therefore the circuit of the present invention can be used in a range of applications where continuous operation of the operational amplifier is necessary, eg pseudo-n-path, double sampling, capacitance spread reduction and same-sample-correction techniques.

The present invention may be applied to any form of circuit that can be constructed using a switched-capacitor circuit. A particularly useful realization of the invention is a switched-capacitor integrator, which is a fundamental building block of all switched-capacitor systems. The implementation of this needs one extra capacitor only. It is therefore very simple and cost effective. More importantly, unlike the previous SO technique outlined in U.S. Pat. No. 5,745,002, the switched-capacitor integrator of the present invention acts like a classical switched-capacitor integrator due to the fact that the output signal is available for processing at both clock phases. As a result, the present invention can be directly and easily employed into most switched-capacitor systems. In fact, without employing an additional opamp, classical switched-capacitor systems can already be operated at low voltage by simply substituting the classical switched-capacitor integrators with the switched-capacitor integrator of the present invention and removing all the problematic switches that are connected to the outputs of the opamps. This shows high compatibility of the proposed switched-capacitor technique with all existing classical switched-capacitor systems.

It should be understood that these are examples only and that the invention may be applied to a wide range of circuit topologies that need the opamps to be functional all the time. For example, by replacing the extra capacitor in the previously mentioned switched-capacitor integrator with some switched-capacitor sub-circuits, multi-phase switched-capacitor techniques, e.g. pseudo-N-path, double-sampling, capacitance-spread-reduction and same-sample-correction can be implemented at low voltage with our proposed switched-opamp technique. Note that all these multi-phase switched-capacitor techniques require the opamps to be functional at all time and thus cannot be implemented with the previous switched-opamp technique. Furthermore, the present invention can also be modified to accompany multiple switchable opamps to work in parallel but in different non-overlapping clock phases to achieve complex multi-phase operation for some advanced switched-capacitor systems.

BRIEF DESCRIPTION OF THE DRAWINGS

Some embodiments of the invention will now be described by way of example and with reference to the accompanying drawings, in which.

DETAILED DESCRIPTION OF PREFERRED EMBODIMENTS

Figure 3:
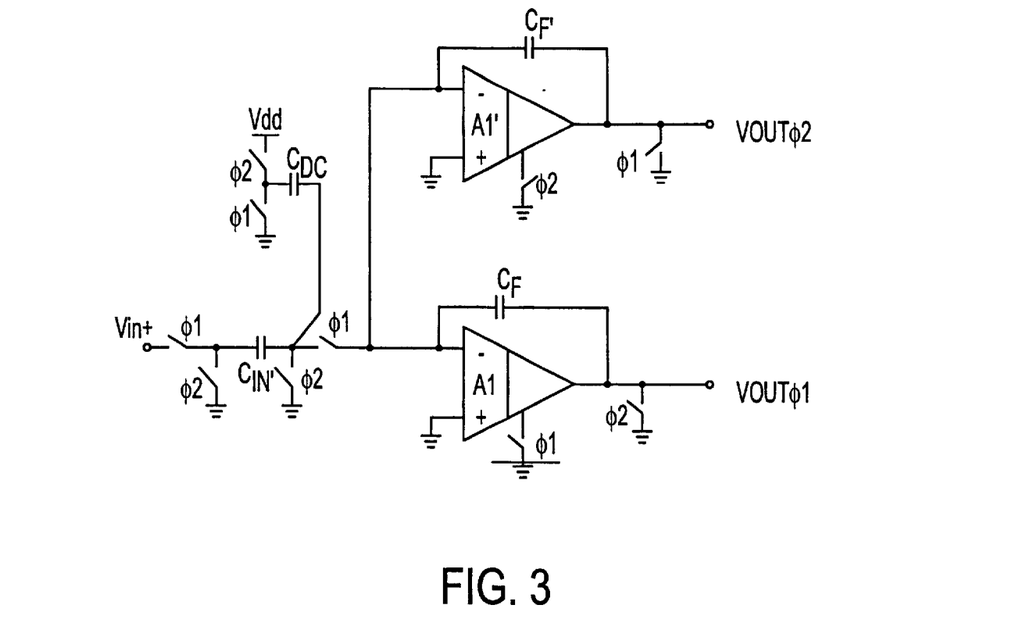
FIG. 3 is a circuit diagram illustrating the basic principle of the present invention.

FIG. 3 shows the basic principle of the present invention which is to employ an additional switchable opamp A1' in parallel to the first opamp A1 but in alternate clock phases $\phi 1$ and $\phi 2$.

Figure 4:
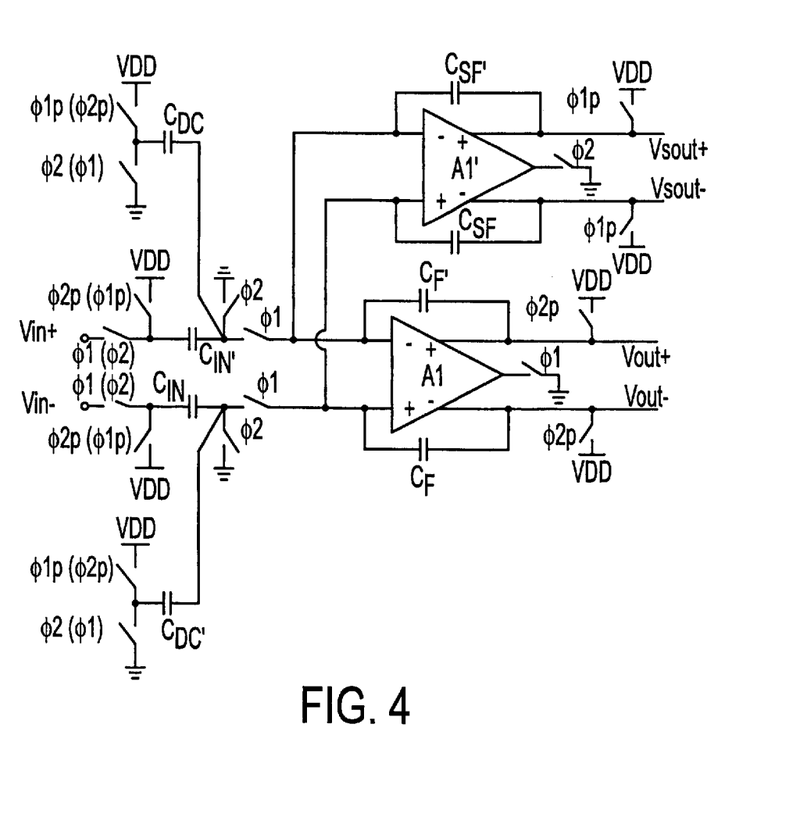
FIG. 4 is a circuit diagram showing an embodiment of the invention in the form of a fully-differential inverting non-delay SC integrator.

FIG. 4 shows a fully-differential inverting non-delay SC integrator that uses the proposed switched-opamp technique for low-voltage switched-capacitor applications. A non-inverting delay SC integrator can be simply obtained using the clock phases shown in parenthesis. It is worth to note that although a differential structure is shown, its single-ended version is also viable. $\phi_{1,2}$ and $\phi_{1p,2p}$ are complementary clock phases for NMOS and PMOS switches, respectively. The dynamic level shifters are adopted and implemented with switched capacitors $C_{DC}$ and $C_{DC}'$, which are half as big as the input capacitors $C_{IN}$ and $C_{IN}'$ respectively. As such, the common-mode input voltages of two switchable opamps are biased at ground, while their outputs, in steady state without input signal, are biased to middle of rails by the use of common-mode feedback circuits. The two switchable opamps are turned on and off alternately in two complementary non-overlapping clock phases.

Consider the inverting non-delay SC integrator configuration in FIG. 4. In $\phi_1$, opamp $A_1$ is turned on, and both the sampled signal from $C_{IN}$ ($C_{IN}'$) and the stored signal in $C_{SF}$ ($C_{SF}'$) are integrated into $C_F$ ($C_F'$), which was charged to $V_{DD}$ during previous $\phi_2$ cycle. In $\phi_2$, opamp $A_1'$ is turned on and the opamp $A_1$ is turned off with its outputs ($V_{out+}$, $V_{out-}$) shorted to $V_{DD}$. In this case, $C_F$ ($C_F'$) is charged to $V_{DD}$ while the signal that stored in $C_F$ ($C_F'$) is passed to $C_{SF}$ ($C_{SF}'$), which was charged to $V_{DD}$ previously in $\phi_1$. When $\phi_1$ comes again, opamp $A_1$ is turned on, while opamp $A_1'$ is turned off with its outputs shorted to $V_{DD}$. By doing so, the signal is passed back to $C_F$ ($C_F'$) again while opamp $A_1$ is integrating with new sampled signal from $C_{IN}$ ($C_{IN}'$). Equation 1 describes the situation mathematically.

$$Vout^+(nT) = \left(\frac{C_{SF}}{C_F}\frac{C_F}{C_{SF}}\right)Vout^+(nT-T) - \frac{C_{IN}}{C_F}Vin^+(nT) \quad \text{(Eq. 1)}$$

$$= Vout^+(nT-T) - \frac{C_{IN}}{C_F}Vin^+(nT)$$

$$Vout^-(nT) = \left(\frac{C_{SF}'}{C_F'}\frac{C_F'}{C_{SF}'}\right)Vout^-(nT-T) - \frac{C_{IN}'}{C_F'}Vin^-(nT)$$

$$= Vout^-(nT-T) - \frac{C_{IN}'}{C_F'}Vin^-(nT)$$

It can be observed that capacitors $C_{SF}$ and $C_{SF}'$ in the Equation 1 are cancelled and hence even capacitors $C_F$ and $C_{SF}$ (as well as $C_F'$ and $C_{SF}'$) are not matched, the output signal obtained in previous cycle still reappears at outputs of opamp $A_1$. Nevertheless, the design is optimal when all capacitors $C_F$, $C_F'$, $C_{SF}$ and $C_{SF}'$ have the same value. If the storage capacitors $C_{SF}$ and $C_{SF}'$ are smaller than the integrating capacitors $C_F$ and $C_F'$, the signal would be amplified by the ratio ($C_{SF}/C_F$ or $C_{SF}'/C_F'$) when it is stored and thus more signal dynamic range would be required from the opamp to prevent it from being distorted. On the other hand, using storage capacitors that are larger than the integrating capacitors would slow down the operation speed and increase the chip area.

With the addition of a switchable opamp $A_1'$, the output signal is available for processing in both clock phases as in a classical SC integrator. As a result, the switched-opamp integrator according to this embodiment of the invention can simply be used to replace the classical SC integrators to realize low-voltage SC circuits. This saves a lot of re-designing efforts to implement SC circuits because the switched-opamp technique of the present invention can be directly adopted to nearly all existing SC circuits. More importantly, due to the creation of an idle phase in this switched-opamp integrator, useful techniques like pseudo-N-path can be implemented in a standard CMOS technology for a very low supply voltage.

In the embodiment of FIG. 4, the input terminals of the two switchable-opamps $A_1$ and $A_1'$ are connected together while only one of the two switchable opamps is turned on at a time. With the two switchable opamps both realized in a two-stage approach, it is sufficient to turn off only the output stages to isolate the signal path while keeping the input stage active at all times for faster switching operation. In a preferred embodiment therefore, the two switchable opamps may be combined into a single two-stage amplifier with one differential input stage and two pairs of differential output stages that are turned on and off alternately. This not only provides a more economical realization for the proposed technique but also minimizes the mismatch between the two switchable opamps that would degrade the system performance. To demonstrate the idea, a 1-V fully-differential two-switchable-output-pair operational amplifier is realized in a 0.5-μm standard CMOS process with NMOS and PMOS threshold voltages of 0.66V and −0.85V respectively.

Figure 5A:
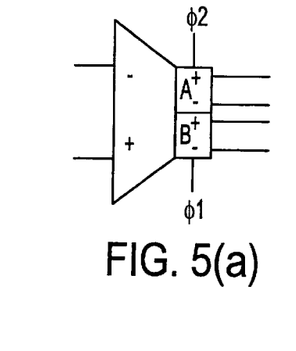
FIG. 5 is a circuit diagram showing an embodiment of the present invention in the form of a two-switchable-output-pair opamp.
Figure 5B:
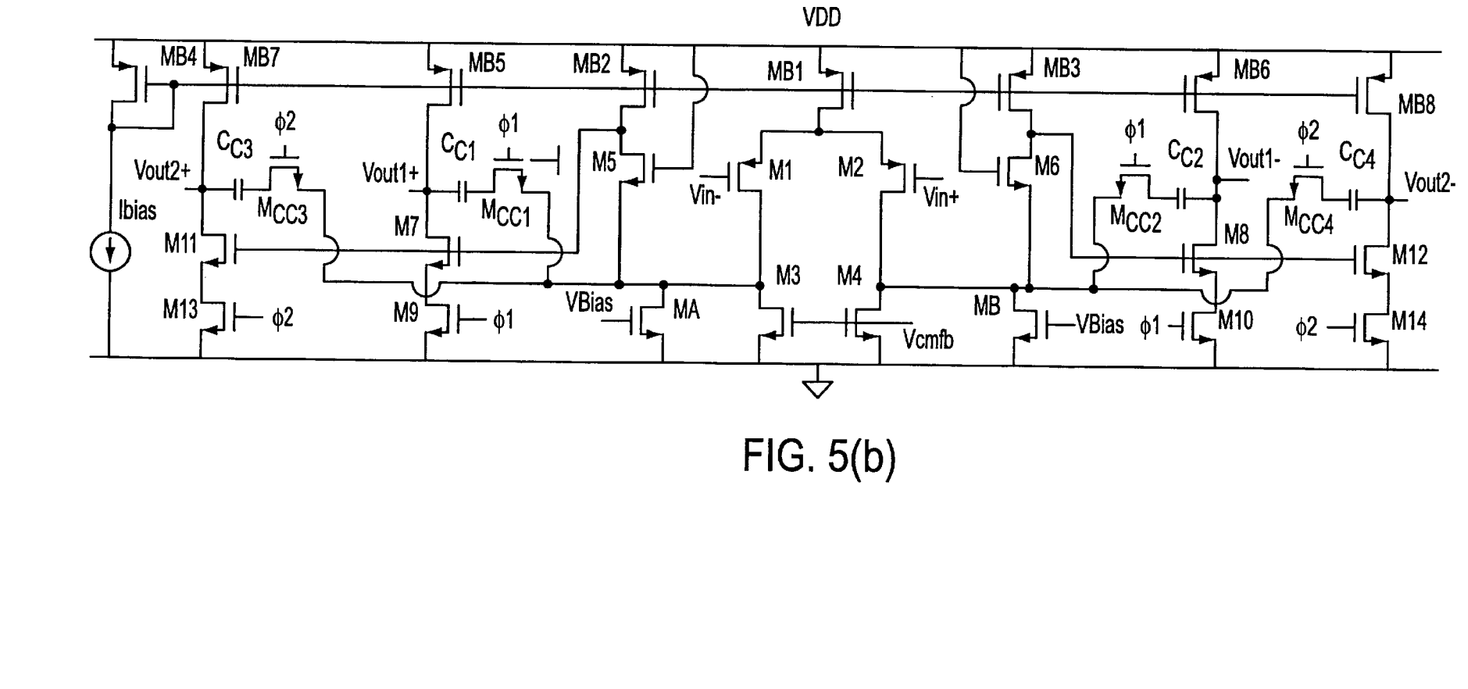

FIG. 5 shows the schematic of the two-switchable-output-pair opamp according to this embodiment. A PMOS differential pair is employed as the input stage. To obtain a large low-frequency gain, level shifters formed by $M_5$, $M_{B2}$ and $M_6$, $M_{B3}$ are inserted to bias $M_3$ and $M_4$ at one $V_{DSsat}$ higher than ground while ensuring $M_1$ and $M_2$ operate in the saturation region. The gates of output transistors $M_7$, $M_8$, $M_{11}$ and $M_{12}$ are connected to the outputs of the level shifters. The output stages are turned on and off by the transistors $M_9$, $M_{10}$, $M_{13}$ and $M_{14}$, which are controlled by two non-overlapping clock phases $\phi_1$ and $\phi_2$. Each of the output stages is connected to a compensation capacitor ($C_{C1}$, $C_{C2}$, $C_{C3}$ and $C_{C4}$) to stabilize the opamp when the output stages are turned on. On the other hand, the output stages are cut-off together with the compensation resistors $M_{CC1}$ and $M_{CC2}$ (or $M_{CC3}$ and $M_{CC4}$) to prevent the compensation capacitors from being charged or discharged for faster switching operation. Transistors $M_3$ and $M_4$ receive control signal from the common-mode feedback circuit while transistors $M_A$ and $M_B$ adjust the common-mode feedback gain by drawing currents from $M_3$ and $M_4$ and thus controlling their transconductances.

Figure 6:
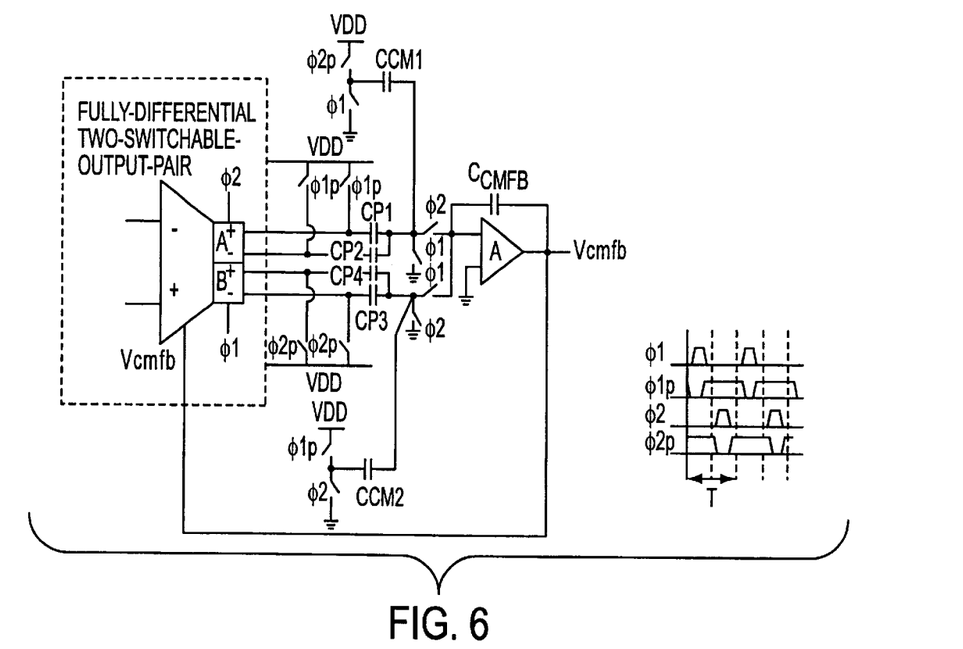
FIG. 6 is a circuit diagram of a dynamic common-mode feedback circuit for use with the embodiment of FIG. 5.

FIG. 6 shows a dynamic common-mode feedback (CMFB) circuit, which may be employed to keep the common-mode voltage of the two switchable output pairs to be at half of the supply voltage. During $\phi_1$, output pair A is off, while $C_{P1}$ and $C_{P2}$ (both 0.1 pF) are charged to $V_{DD}$ and $C_{CM1}$ is completely discharged. During $\phi_2$, the loop is closed with output pair A turned on, $C_{P1}$ and $C_{P2}$ discharged from $V_{DD}$ to the DC output voltage of the switchable opamp. This causes charge injection to the $C_{CMFB}$ (0.2 pF) through the virtual ground of the opamp of the CMFB integrator. On the other hand, $C_{CM1}$ is charged from $C_{CMFB}$ through the virtual ground. The CMFB circuit reaches steady state at $\phi_2$ when no charge is injected into or collected from the $C_{CMFB}$. Therefore, with $C_{CM1}=C_{P1}=C_{P2}$, the common-mode voltage of output pair A will be forced to $V_{DD}/2$ by the common-mode feedback circuit. Since the integrator in the dynamic CMFB circuit is idle during $\phi_1$ when output pair A is off, it can be utilized to control the common-mode voltage of output pair B, which is turned on during $\phi_1$. In this case, $C_{P3}$, $C_{P4}$ and $C_{CM2}$ are used as the sensing elements instead. Under similar operation, with $C_{CM2}=C_{P3}=C_{P4}=0.1$ pF, the common-mode voltage of output pair B is forced to $V_{DD}/2$ by the common-mode feedback circuit during $\phi_1$. The CMFB integrator is implemented with a PMOS differential-pair with a low-frequency gain of about 100. A prototype of the proposed switchable opamp has been designed using a 0.5-μm CMOS technology. Table 1 lists the transistor sizes used and Table 2 summarizes the measured performance of the switchable opamp of the embodiment of FIG. 5.

TABLE 1

| | | | |
|---|---|---|---|
| M1, M2 | 144 μm/2.1 μm | MB1 | 244.8 μm/2.1 μm |
| M3, M4 | 36 μm/3 μm | MB2, MB3, MB5 MB6, MB7, MB8 | 204 μm/2.1 μm |
| MA, MB | 60 μm/3 μm | M9, M10, M13, M14 | 26.4 μm/2.1 μm |
| M5, M6, M7, M8, M11, M12 | 66 μm/2.1 μm | MCC1, MCC2 MCC3, MCC4 | 51 μm/0.6 μm |
| MB$ | 40.8 μm/2.1 μm | | |

TABLE 2

| | |
|---|---|
| Technology | 0.5 -μm CMOS |
| Supply Voltage | 1 V |
| Low Frequency Gain | 69 dB |
| Unity Gain Bandwidth | 7 MHz |
| Phase Margin | 45° |
| Power Consumption | 80 μW |
| Chip Area | 100 μm × 50 μm |

Figure 7:
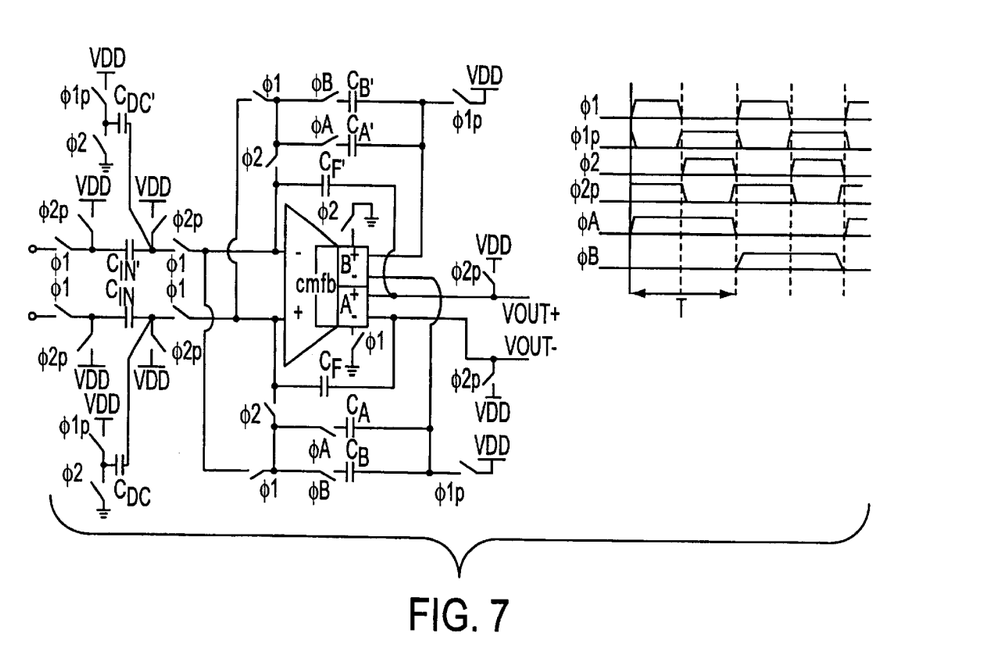
FIG. 7 shows an embodiment of the invention in the form of a switched-opamp RAM-type pseudo-2-path integrator.

FIG. 7 shows an embodiment of the invention in the form of a switched-opamp RAM-type pseudo-2-path integrator using the proposed fully-differential two-switchable-output-pairs opamp with the dynamic CMFB circuit embedded as described above.

For proper biasing, the dynamic level shifter as described above is used. $C_F$ and $C_F'$ are the integrating capacitors while $C_A$ ($C_A'$) and $C_B$ ($C_B'$) are for the storage array. When $\phi_A$ and $\phi_1$ are on, output pair A is turned on to connect $C_F$ and $C_F'$ in feedback configuration while output pair B is off with its outputs shorted to $V_{DD}$. $C_F$ ($C_F'$) receives the charge from $C_{IN}$ ($C_{IN}'$) and from $C_A'$ ($C_A$) from the opposite path. This operation gives the sign inversion required by the z→−z transformation. When $\phi_A$ and $\phi_2$ are on, output pair B is turned on to connect the storing capacitors $C_A$ and $C_A'$ in feedback configuration while output pair A is turned off with its outputs shorted to $V_{DD}$. In this way, the updated charge in $C_F$ ($C_F'$) is transferred back to $C_A$ ($C_A'$). This charge is then held in $C_A$ ($C_A'$) for two sampling periods. The same operation is repeated during $\phi_B$ with the charge stored in $C_B$ ($C_B'$) instead of $C_A$ ($C_A'$). By doing so, z→−$z^2$ transformation is successfully realized with the fully-differential two-switchable-output-pair opamp. It should be noted in this embodiment that the capacitors $C_A$ ($C_A'$) and $C_B$ ($C_B'$) function as transfer means to effect these transformations.

Figure 8:
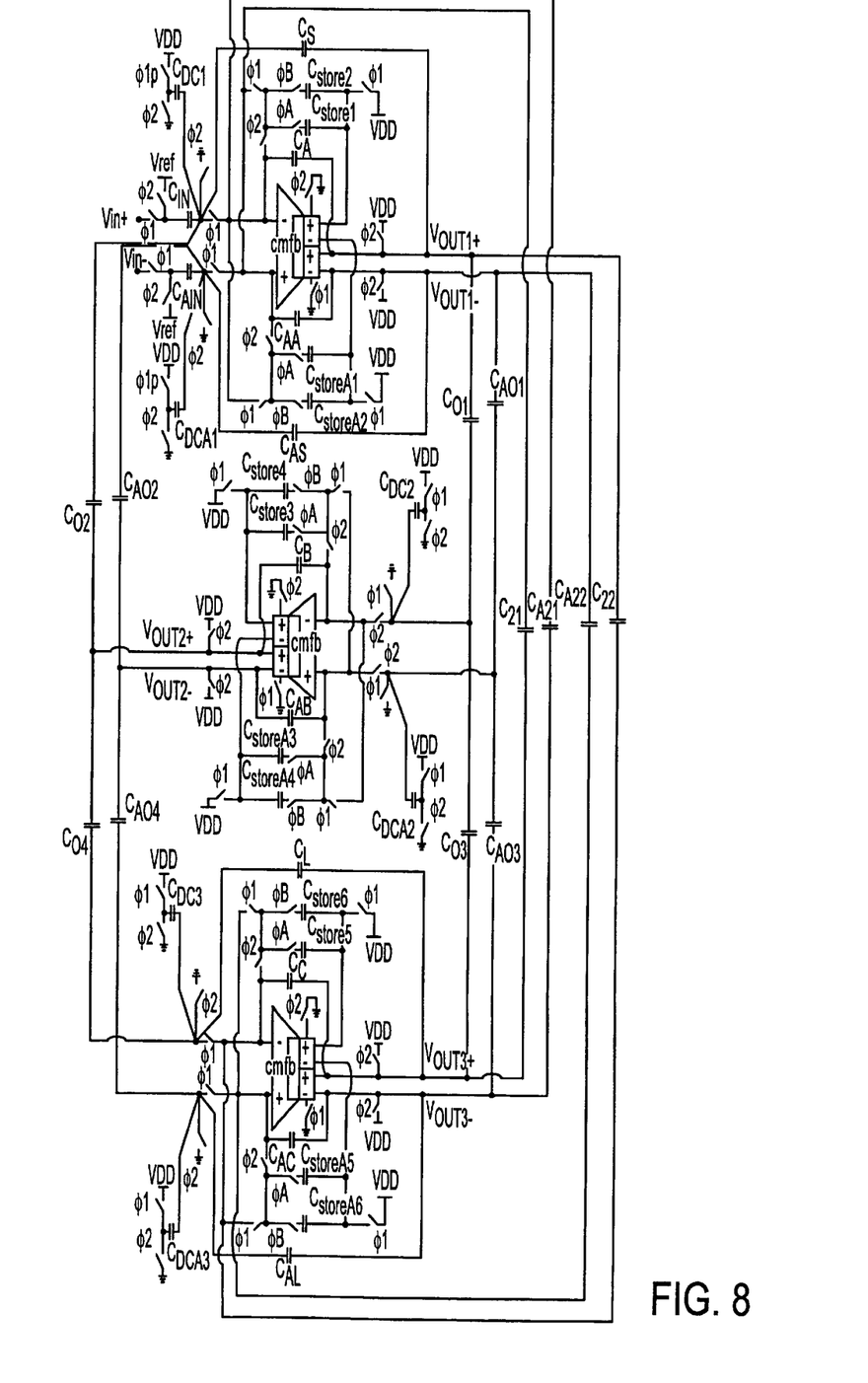
FIG. 8 shows an embodiment of the invention in the form of a switched-opamp SC pseudo-2-path filter.

FIG. 8 shows the schematic of an embodiment of the invention in the form of a switched-opamp SC pseudo-2-path filter, which is synthesized by replacing the integrators in a $3^{rd}$-order SC lowpass ladder filter with the switched-opamp RAM-type pseudo-2-path integrator and simultaneously making the coupling capacitors $C_{21}$, $C_{A21}$, $C_{22}$ and $C_{A22}$ memoryless. A fully-differential structure not only helps reject common-mode noise and reduce clock-feedthrough noise but also provides a free sign inversion of the output voltages, which is required in the z→−z transformation. Since only one pair of output stages is active at a time, the resulting 1-V SC pseudo-2-path filter uses the same number of-opamps as its classical counterpart.

Figure 9A:
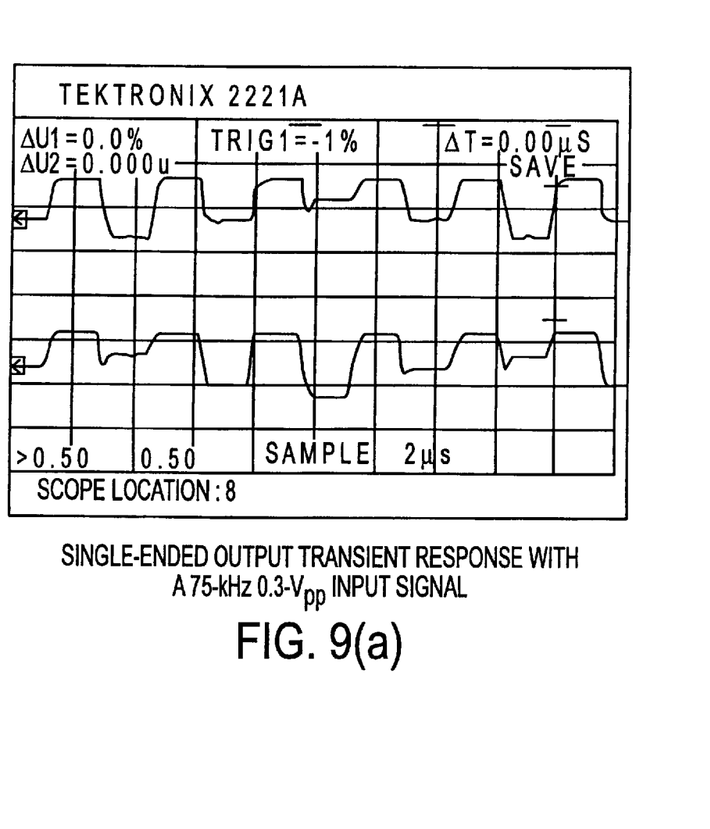
FIGS. 9(a)–(c) show the measured transient responses and frequency spectrum for the filter of FIG. 8.
Figure 9B:
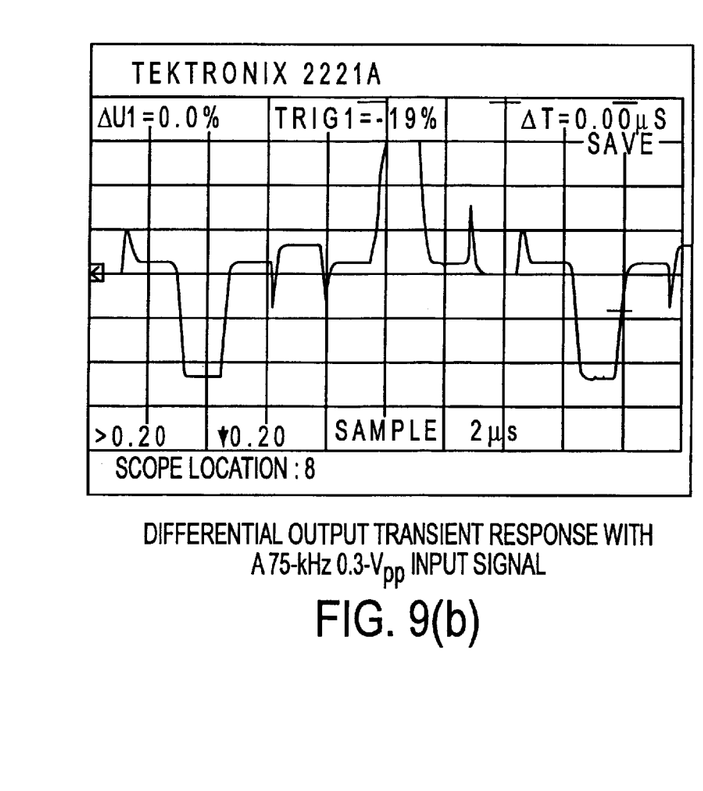
Figure 9C:
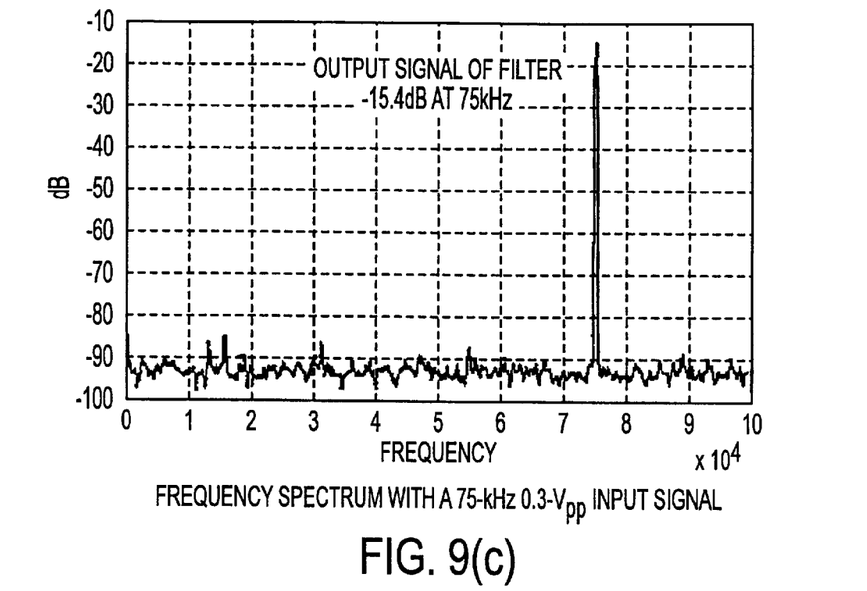

Table 3 summarizes the capacitor values used while the measured transient responses for a single-ended output and the differential output of the filter with a 75-kHz 0.3-$V_{pp}$ in-band input are shown, respectively, in FIGS. 9(a) and 9(b). The corresponding frequency spectrum for the differential output signal is shown in FIG. 9(c).

TABLE 3

| | |
|---|---|
| $C_A$, $C_{AA}$, $C_{store1}$, $C_{storeA1}$, $C_{store2}$, $C_{storeA2}$ | 4.5 pF |
| $C_B$, $C_{AB}$, $C_{store3}$, $C_{storeA3}$, $C_{store4}$, $C_{storeA4}$ | 5 pF |
| $C_C$, $C_{AC}$, $C_{store5}$, $C_{storeA5}$, $C_{store6}$, $C_{storeA6}$ | 3.5 pF |
| $C_{IN}$, $C_{AIN}$ | 0.59 pf |
| $C_S$, $C_{AS}$ | 0.14 pF |
| $C_{02}$, $C_{A02}$, $C_{03}$, $C_{A03}$ | 0.1 pF |
| $C_{01}$, $C_{A01}$ | 0.15 pF |
| $C_{21}$, $C_{A21}$ | 0.13 pF |
| $C_{22}$, $C_{A22}$ | 0.21 pF |
| $C_L$, $C_{AL}$ | 0.1 pF |
| $C_{DC1} = (C_S + C_{02})/2$, $C_{DCA1} = (C_{AS} + C_{A02})/2$ | 0.17 pF |
| $C_{DC2} = (C_{01} + C_{03})/2$, $C_{DCA2} = (C_{A01} + C_{A03})/2$ | 0.13 pF |
| $C_{DC3} = (C_L + C_{04})/2$, $C_{DCA} = (C_{AL} + C_{A04})/2$ | 0.1 pF |

It can be observed that the filter according to the embodiment of FIG. 8 settles properly even for a differential output signal amplitude as large as 1.2 $V_{pp}$. From the above waveforms, it is evident that the proposed switched-opamp mechanism is also based on the fact that during one clock phase the output node is tied to the power supply and the output signal is not available, which is the same as in the case of the previous switched-opamp technique. This causes a return-to-zero effect, which reduces the passband gain of the filter by 6 dB if the signal is processed continuously. Hence, it must be taken into account when the filter passband gain is designed. In order to fully utilize the output swing of the filter of this embodiment, the filter is designed to achieve about 10 dB passband gain for sampled-and-held output signal waveforms. In this case, the peak-to-peak filter output signal is about 4 times of that of the input signal in the passband. This is because the input signal swing of the filter is limited to be less than 0.3 $V_{pp}$ due to the turn-on requirements of the input switches.

Figure 10:
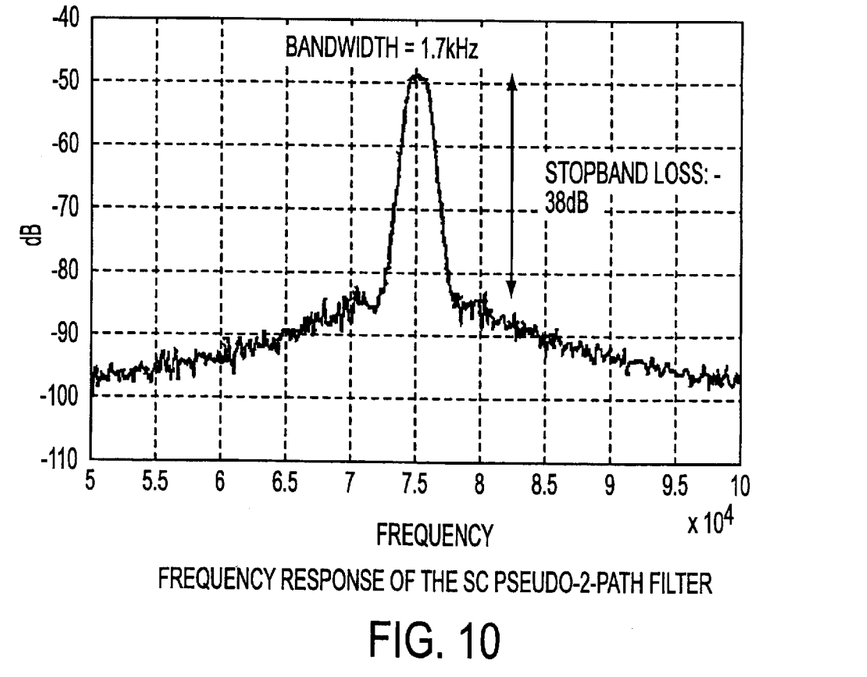
FIG. 10 shows the measured frequency response of the filter of FIG. 8, FIGS. 11(a) and (b) show the distortion results of the filter of FIG. 8.
Figure 11A:
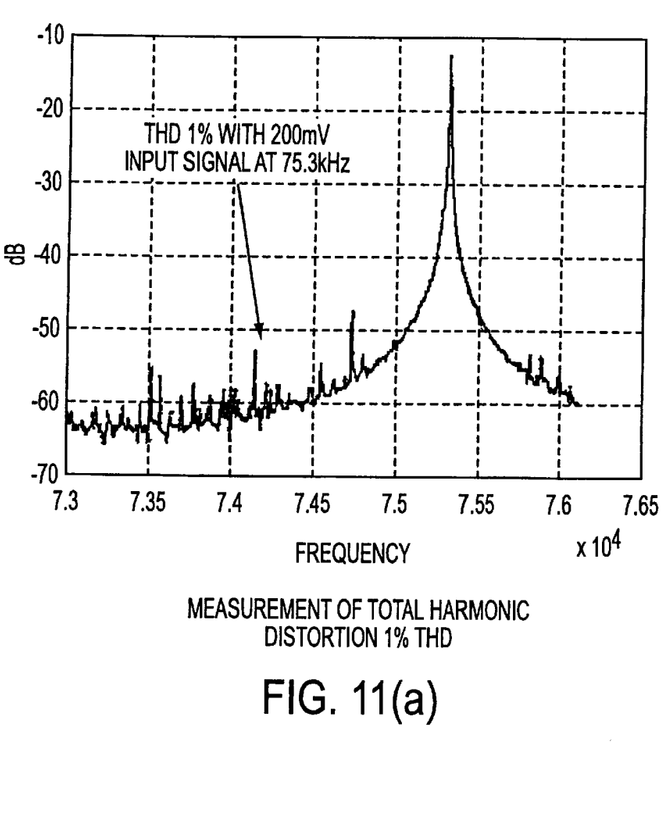
Figure 11B:
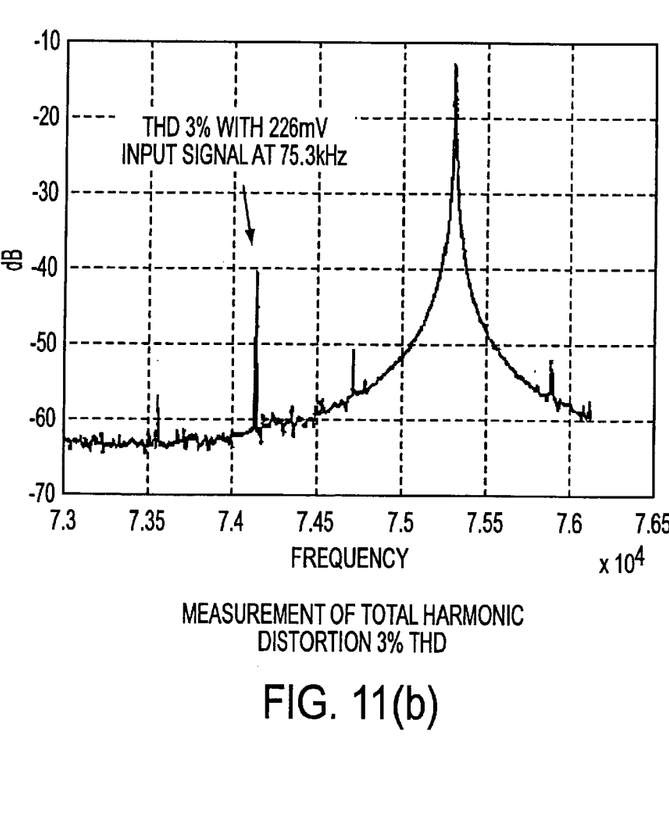

FIG. 10 shows the measured frequency response of the filter according to the embodiment of FIG. 8. The filter achieves a $6^{th}$-order bandpass response with a bandwidth of 1.7 kHz and a passband gain of 1 dB. A minimum stopband loss relative to passband of −38 dB is measured at frequencies of 72.5 kHz and 77.5 kHz. As a property of a pseudo-2-path filter that utilizes the first bandpass response, the center frequency of the interested passband is located at 75 kHz, which is exactly ¼ of the sampling frequency (300 kHz). The third-harmonic distortion is measured with an in-band input signal at frequency at $f_{in}$=75.3 kHz. The third-harmonic component of the input signal is located at $3*f_{in}$=225.9 kHz and is folded at $f_s-3*f_{in}$=74.7 kHz, which is in the passband of the filter. FIGS. 11(a) and 11(b) show the measurement results for 1% and 3% total harmonic distortion (THD) respectively.

The 1% THD corresponds to a 0.42-$V_{pp}$ input signal and the 3% THD to a 0.45-$V_{pp}$ input signal. The measured total output noise of the filter is about 1 $mV_{rms}$. The dynamic range for 3% THD is about 54 dB. Table 4 summarizes the filter performance.

TABLE 4

| | |
|---|---|
| Technology | 0.5 -μm CMOS |
| Supply Voltage | 1 V |
| Center frequency | 75 kHz |
| Q-value | 45 |
| Sampling frequency | 300 kHz |
| Max. output swing | 1.4 $V_{pp}$ |
| Total output noise | 1 mVrms |
| THD 1% | 416 $mV_{pp}$ |
| THD 3% | 452 $mV_{pp}$ |
| Dynamic range (for 3% THD) | 54 dB |
| Power consumption | 310 μW |
| Chip area | 0.8 mm² |

Figure 12:
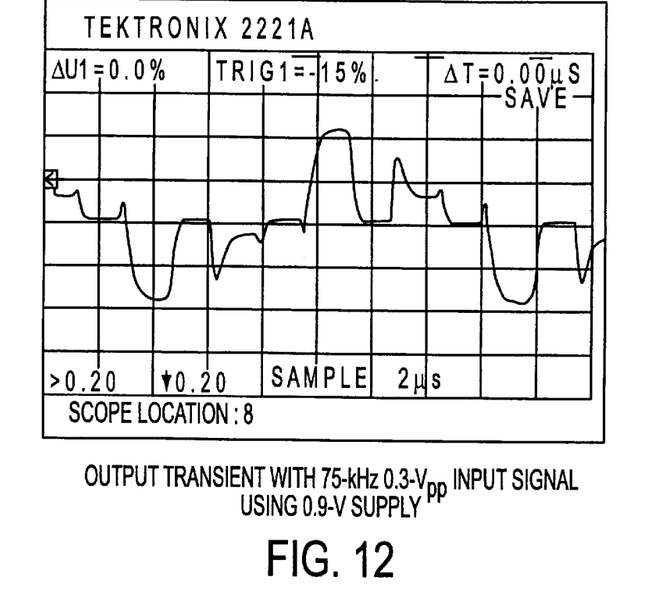
FIG. 12 shows the transient response of the filter of FIG. 8 with a single 0.9V supply.
Figure 13:
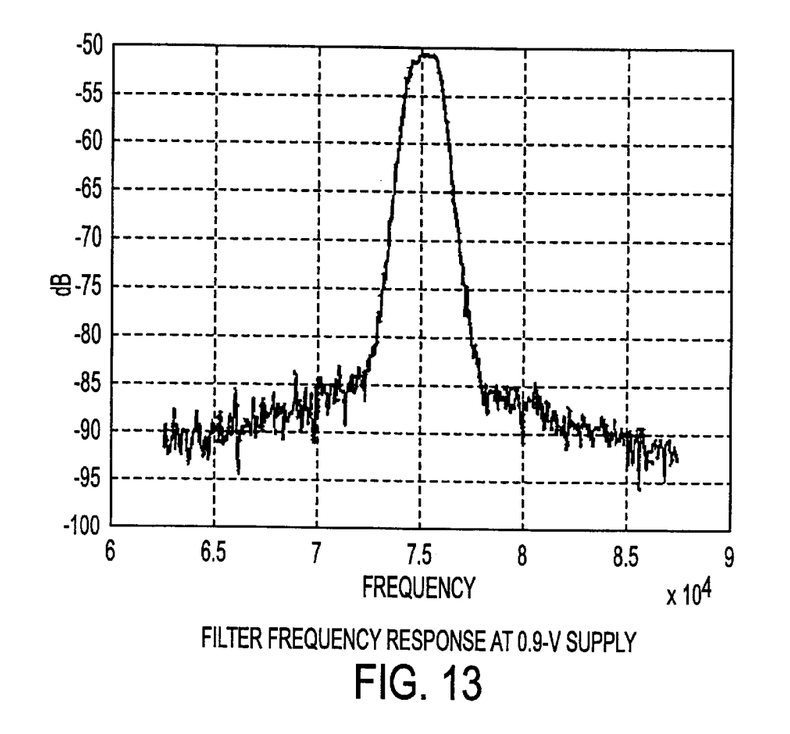
FIG. 13 shows the frequency response of the filter of FIG. 12.

The filter of the embodiment of FIG. 8 may also be tested with a single 0.9-V voltage supply. The transient differential output response with a 75-kHz 0.3-$V_{pp}$ input signal is shown in FIG. 12, from which the filter is still observed to settle correctly. FIG. 13 shows the frequency response of the filter, which is quite similar to the one measured with a 1-V supply.

It will thus be seen that the present invention provides a novel switched-opamp technique using a second switchable opamp operating in parallel with the first switchable opamp. In a particularly preferred embodiment a fully-differential two-switchable-output-pair opamp may be used, with the output signal being available in any clock cycle, and hence useful SC techniques like pseudo-N-path can be implemented at low supply voltages. In a preferred embodiment the invention may be illustrated through the design and implementation of a 1-V SC pseudo-2-path filter using the proposed switched-opamp technique in a 0.5-μm standard CMOS process. It will be understood, however, that the invention can be applied to a wide range of circuit topologies by directly replacing the integrators of the conventional SC circuits with the integrators of the present invention and simply removing all the problematic switches connected at the outputs

What is claimed is:

1. A switched opamp circuit comprising two switchable operational amplifiers having common input terminals and operating in parallel and in alternate clock phases, wherein one and only one of the switchable operational amplifiers is turned on at any time, each said operational amplifier having a capacitor in a feedback circuit, and wherein the respective outputs of said operational amplifiers are connected to switches that connect said outputs to a reference voltage when said amplifiers are not turned on.

2. A circuit as claimed in claim 1 wherein said two switchable operational amplifiers are effectively implemented by a two-stage switchable operational amplifier comprising a common input stage and two pairs of switchable output stages.

3. A circuit as claimed in claim 2 wherein said circuit is a differential circuit and a feedback circuit is used to maintain the common-mode voltage of the said switchable output pairs at half the supply voltage.

4. A circuit as claimed in claim 1 wherein said circuit is an integrator circuit.

5. A circuit as claimed in claim 2 wherein said circuit is an integrator circuit.

6. An integrator circuit comprising a switched opamp circuit, said opamp circuit comprising two switchable operational amplifiers having common input terminals and operating in parallel and in alternate clock phases, wherein one and only one of the switchable operational amplifiers is turned on at any time.

7. A circuit as claimed in claim 6 wherein said two operational amplifiers are implemented by an operational amplifier comprising a common input stage and two switchable output pairs.

8. A circuit as claimed in claim 7 wherein said circuit is a differential circuit and a feedback circuit is used to maintain the common-mode voltage of the said switchable output pairs at half the supply voltage.

9. A circuit as claimed in claim 6 wherein each said operational amplifier is provided with associated signal transformation means.

10. A circuit as claimed in claim 9 wherein said signal transformation means comprises a feedback capacitor.

11. A circuit as claimed in claim 9 wherein said signal transformation means comprises a feedback switched capacitor network.

12. A circuit as claimed in claim 7 wherein each said operational amplifier or each said output pair is provided with associated signal transformation means.

13. A electronic filter means comprising at least one integrator circuit, wherein said integrator circuit comprises a switched opamp circuit comprising two switchable operational amplifiers having common input terminals and operating in parallel and in alternate clock phases, wherein one and only one of the switchable operational amplifiers is turned on at any time.

14. A filter means as claimed in claim 13 wherein said two operational amplifiers are effectively implemented by a two-stage operational amplifier comprising a common input stage and two pairs of switchable output stages.

15. A filter means as claimed in claim 14 wherein said circuit is a differential circuit and a feedback circuit is used to maintain the common-mode voltage of said switchable output pairs at half the supply voltage.

16. A filter means as claimed in claim 13 wherein each said operational amplifier is provided with associated signal transformation means.

17. A filter as claimed in claim 16 wherein each said signal transformation means comprises a feedback capacitor.

18. A filter as claimed in claim 16 wherein each said signal transformation means comprises a feedback switched capacitor network.

19. A filter means as claimed in claim 13 wherein said filter means comprises a pseudo-n-path filter.

20. A filter means as claimed in claim 14 wherein each said operational amplifier or each said output pair is provided with associated signal transformation means.

21. A switched capacitor circuit comprising two switchable operational amplifiers having common input terminals and operating in parallel and in alternate clock phases, wherein one and only one of the switchable operational amplifiers is turned on at any time.

22. A circuit as claimed in claim 21 wherein said two operational amplifiers are effectively implemented by a two-stage operational amplifier comprising a common input stage and two pairs of switchable output stages.

23. A circuit as claimed in claim 22 wherein said circuit is a differential circuit and a feedback circuit is used to maintain the common-mode voltage of the said switchable output pairs at half the supply voltage.

24. A switched differential circuit comprising two switchable operational amplifiers operating in parallel and in alternate clock phases, said operational amplifiers being effectively implemented by a two-stage operational amplifier having a common input stage and two pairs of switchable output stages, and a feedback circuit for maintaining the common-mode voltage of said switchable output stages at half the supply voltage.

25. An integrator circuit comprising a switched opamp circuit, said opamp circuit comprising two switchable operational amplifiers operating in parallel and in alternate clock phases, said operational amplifiers being effectively implemented by a two-stage operational amplifier having a common input stage and two pairs of switchable output stages.

26. A circuit as claimed in claim 25 wherein said circuit is a differential circuit, and further including a feedback circuit for maintaining the common-mode voltage of said switchable output stages at half the supply voltage.

27. An electronic filter means comprising at least one integrator circuit, wherein said integrator circuit comprises a switched opamp circuit comprising two switchable operational amplifiers operating in parallel and in alternate clock phases, said operational amplifiers being effectively implemented by a two-stage operational amplifier comprising a common input stage and two pairs of switchable output stages.

28. A filter means as claimed in claim 27 wherein said circuit is a differential circuit, and further including a feedback circuit for maintaining the common-mode voltage of the said switchable output stages at half the supply voltage.

29. A differential capacitor circuit comprising two switchable operational amplifiers operating in parallel and in alternate clock phases, said operational amplifiers being effectively implemented by a two-stage operational amplifier comprising a common input stage and two pairs of switchable output stages, and a feedback circuit for maintaining the common-mode voltage of said switchable output stages at half the supply voltage.

* * * * *